(12) United States Patent
Shabbir et al.

(10) Patent No.: US 10,136,558 B2
(45) Date of Patent: Nov. 20, 2018

(54) INFORMATION HANDLING SYSTEM THERMAL MANAGEMENT ENHANCED BY ESTIMATED ENERGY STATES

(71) Applicant: Dell Products L.P., Round Rock, TX (US)

(72) Inventors: Hasnain Shabbir, Round Rock, TX (US); Dominick A. Lovicott, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 630 days.

(21) Appl. No.: 14/446,704

(22) Filed: Jul. 30, 2014

(65) Prior Publication Data

US 2016/0037686 A1 Feb. 4, 2016

(51) Int. Cl.
*G06F 1/20* (2006.01)
*H05K 7/20* (2006.01)

(52) U.S. Cl.
CPC ......... *H05K 7/20727* (2013.01); *G06F 1/206* (2013.01); *Y02D 10/16* (2018.01)

(58) Field of Classification Search
CPC .................. H05K 7/20727; G06F 1/206
See application file for complete search history.

(56) References Cited

U.S. PATENT DOCUMENTS

| 4,722,669 | A | | 2/1988 | Kundert |
| 5,101,040 | A | | 3/1992 | Cohen |
| 5,102,040 | A | | 4/1992 | Harvey |
| 6,011,689 | A | * | 1/2000 | Wrycraft ............... G06F 1/20 361/679.31 |
| 6,349,029 | B1 | * | 2/2002 | Leman ............... G06F 1/18 16/221 |
| 6,353,541 | B1 | * | 3/2002 | Leman ............... G06F 1/183 211/41.17 |
| 6,356,438 | B1 | * | 3/2002 | Leman ............... G06F 1/183 206/701 |
| 6,430,041 | B1 | * | 8/2002 | Johnson ............... G06F 1/181 165/126 |
| 6,452,797 | B1 | * | 9/2002 | Konstad ............... H01L 23/467 165/80.3 |
| 6,826,456 | B1 | * | 11/2004 | Irving ............... G06F 1/20 361/695 |

(Continued)

OTHER PUBLICATIONS

Yu, C.-W. and Webb, R.L., "Thermal Design of a Desktop Computer SystemUsing CFD Analysis", 2001, 17th IEEE Semi-Therm Symposium.*

(Continued)

*Primary Examiner* — Mohammad Ali
*Assistant Examiner* — Kelvin Booker
(74) *Attorney, Agent, or Firm* — Zagorin Cave LLP; Robert Holland (57) ABSTRACT

Thermal conditions at processing components disposed in an information handling system are estimated by applying conservation of energy and component power consumption so that discrete control of information handling system exhaust temperatures is more accurately maintained. For example, a PCI backplane communications card has its power consumption estimated based upon its width so that air flow through the information handling system is adequate to meet an exhaust temperature constraint.

18 Claims, 7 Drawing Sheets

(56) References Cited

U.S. PATENT DOCUMENTS

| | | | |
|---|---|---|---|
| 6,868,652 B2 | 3/2005 | Arends et al. | |
| 7,130,719 B2 | 10/2006 | Ehlers et al. | |
| 7,424,343 B2 | 9/2008 | Kates | |
| 7,472,215 B1* | 12/2008 | Mok | G06F 1/1632 165/80.3 |
| 8,532,826 B2 | 9/2013 | Moss et al. | |
| 9,329,586 B2* | 5/2016 | Artman | G05B 15/02 |
| 2002/0126431 A1* | 9/2002 | Yanagisawa | G06F 1/20 361/103 |
| 2003/0030952 A1* | 2/2003 | Larson | G06F 1/18 361/58 |
| 2003/0031189 A1* | 2/2003 | Larson | H04L 29/06 370/401 |
| 2003/0033393 A1* | 2/2003 | Larson | H04L 29/12254 709/222 |
| 2003/0033464 A1* | 2/2003 | Larson | G06F 13/4081 710/302 |
| 2003/0033466 A1* | 2/2003 | Larson | G06F 11/0709 710/305 |
| 2003/0033546 A1* | 2/2003 | Bresniker | G06F 1/18 713/300 |
| 2003/0033547 A1* | 2/2003 | Larson | G06F 1/18 713/300 |
| 2003/0084357 A1* | 5/2003 | Bresniker | G06F 1/3203 713/320 |
| 2003/0084358 A1* | 5/2003 | Bresniker | G06F 1/3203 713/324 |
| 2003/0084359 A1* | 5/2003 | Bresniker | G06F 1/3203 713/324 |
| 2004/0062013 A1* | 4/2004 | Kim | G06F 1/184 361/752 |
| 2004/0075981 A1* | 4/2004 | Kim | G06F 1/206 361/679.47 |
| 2004/0133314 A1 | 7/2004 | Ehlers et al. | |
| 2005/0047107 A1* | 3/2005 | Pan | G06F 1/18 361/807 |
| 2005/0174737 A1* | 8/2005 | Meir | G06F 1/20 361/697 |
| 2005/0216221 A1 | 9/2005 | Broyles et al. | |
| 2006/0064999 A1* | 3/2006 | Hermerding | G06F 1/206 62/259.2 |
| 2006/0214014 A1 | 9/2006 | Bash et al. | |
| 2006/0262474 A1* | 11/2006 | Chen | G06F 1/206 361/103 |
| 2007/0035924 A1* | 2/2007 | Westphall | G06F 1/183 361/679.48 |
| 2007/0140030 A1* | 6/2007 | Wyatt | G11C 5/00 365/212 |
| 2007/0233402 A1* | 10/2007 | Li | G06F 1/206 702/33 |
| 2008/0028778 A1* | 2/2008 | Millet | G06F 1/206 62/129 |
| 2008/0059001 A1* | 3/2008 | Artman | G06F 1/206 700/299 |
| 2009/0044027 A1* | 2/2009 | Piazza | G06F 1/206 713/300 |
| 2009/0055157 A1* | 2/2009 | Soffer | G06F 15/7864 703/27 |
| 2009/0099696 A1 | 4/2009 | Artman et al. | |
| 2009/0167228 A1 | 7/2009 | Chung et al. | |
| 2009/0265568 A1 | 10/2009 | Jackson | |
| 2009/0296342 A1 | 12/2009 | Matteson et al. | |
| 2010/0027220 A1* | 2/2010 | Hughes | H05K 7/20445 361/702 |
| 2010/0179695 A1 | 7/2010 | Collins et al. | |
| 2010/0194321 A1 | 8/2010 | Artman et al. | |
| 2010/0262863 A1* | 10/2010 | Hess | G06F 11/0748 714/32 |
| 2010/0268398 A1* | 10/2010 | Berz | G06F 1/206 700/300 |
| 2011/0046812 A1* | 2/2011 | Hansen | G06F 1/206 700/300 |
| 2011/0077796 A1 | 3/2011 | Aklilu et al. | |
| 2011/0224837 A1 | 9/2011 | Moss et al. | |
| 2012/0026686 A1* | 2/2012 | Suzuki | F24F 11/0001 361/689 |
| 2012/0329377 A1 | 12/2012 | Wu | |
| 2013/0018523 A1* | 1/2013 | Rubenstein | G05D 23/1919 700/300 |
| 2013/0033819 A1* | 2/2013 | Chiu | G06F 1/20 361/695 |
| 2013/0073096 A1* | 3/2013 | Brey | G05B 13/02 700/282 |
| 2013/0107905 A1* | 5/2013 | Campbell | G01F 25/0007 374/1 |
| 2013/0258582 A1* | 10/2013 | Shelnutt | G06F 1/206 361/679.48 |
| 2013/0332757 A1 | 12/2013 | Moss et al. | |
| 2014/0117908 A1* | 5/2014 | Busch | H02P 1/04 318/471 |
| 2014/0266405 A1* | 9/2014 | Barnes | G06F 1/1626 327/513 |
| 2014/0277750 A1* | 9/2014 | Artman | G05B 15/02 700/275 |
| 2015/0198957 A1* | 7/2015 | Montero | G06F 1/206 700/300 |
| 2015/0256421 A1* | 9/2015 | Kawai | H04L 43/16 709/224 |
| 2016/0195856 A1* | 7/2016 | Spero | G06N 5/046 700/90 |
| 2017/0139453 A1* | 5/2017 | Shabbir | G06F 1/206 |

OTHER PUBLICATIONS

Chang, J.Y., Yu, C.W., and Webb, R.L., "Identification of Minimum Air Flow Design for a Desktop Computer Using CFD Modeling", 2000, Inter Society Conference on Thermal Phenome.*

Anandakrishman, M. and Balaji, C., "CFD Simulations of Thermal and Flow Fields Inside a Desktop Personal Computer Cabin with Milti-core Processors", 2009, Engineering Applications of Comutational Fluid Mechanics, vol. 3, No. 2, pp. 277-288.*

Duff, M. and Towey, J., "Two Ways to Measure Temperature Using Thermocouples Feature Simplicity, Accuracy and Flexibility", Oct. 2010, Analog Dialogue, 44-10.*

Korkmaz, H. and Can, B., "Fuzzy Logic-Based Digital Filtering for Temperature Measurement via K-type Thermocouple", Jul. 2003, CIMSA 2003, International Symposium on Computational Intelligence for Measurement Systems and Applications.*

McGowen, R.; Poirier, C.A.; Bostak, C.; Ignowski, J.; Millican, M.; Parks, W.H. and Niffziger, S., "Power and Temperature Control on a 90-nm Itanium Family Processor", Jan. 2006, IEEE Journal of Solid-State Circuits, vol. 41, No. 1.*

Sonnaillon, M.O.; Bisheimer, G.; De Angelo, C. and Garcia, G.O., "Online Sensorless Induction Motor Temperature Monitoring", Jun. 2010, IEEE Transactions on Energy Conversion, vol. 25, No. 2.*

Al-Tayie, J.K. and Acarnley, P.P., "Estimation of Speed, Stator Temperature and Rotor Temperature in Cage Induction Motor Drive Using the Extended Kalman Filter Algorithm", Sep. 1997, IEE Proc. Electr. Power Appl., vol. 144, No. 5.*

* cited by examiner

INFORMATION HANDLING SYSTEM 10
HOUSING 12
$T_{INLET}$
SYSTEM POWER
$T_{EXHAUST}$

EXHAUST TEMPERATURE ENERGY BALANCE (52)

$T\_exhaust = (1.76 \times POWER/CFM) + T_{INLET}$ (54) POWER:
$POWER = \sum_{n=0}^{n} POWER \times SCALING\ FACTOR + \ldots + P_{static}$
n : iDRAC ITERATION (56) CFM:
$CFM_{BASE} = A \times PWM^4 + B \times PWM^3 + C \times PWM^2 + D \times PWM + E$
$CFM = CFM_{BASE} \times (1 + SCALING\ FACTOR \times COMPONENT\ COUNT) \times \ldots$ (58) $T_{INLET}$

| ENERGY BALANCE NUMBER | SCALING FACTORS | | | | | AVERAGE NUMBER OF READINGS | PWM-TO-CFM CORRELATION | | | | | SCALING FACTORS | | | | | SENSOR NAME |
|---|---|---|---|---|---|---|---|---|---|---|---|---|---|---|---|---|---|
| | TOTAL SYSTEM | CPU SUBSYSTEM | STORAGE SUBSYSTEM | PCI SUBSYSTEM | STATIC POWER VALUE | N | A | B | C | D | E | FAN COUNT | HDD COUNT | PCIe COUNT | CPU COUNT | MEMORY COUNT | $T_{AMBIENT}$ |
| EB1 | 1 | 0 | 0 | 0 | 0 | 60 | 0 | 0 | 0 | 0.9 | 10 | 0 | -0.008 | 0 | 0 | 0 | |
| ∘∘∘ | | | | | | | | | | | | | | | | | |

INFORMATION HANDLING SYSTEM THERMAL MANAGEMENT ENHANCED BY ESTIMATED ENERGY STATES

BACKGROUND OF THE INVENTION

Field of the Invention

The present invention relates in general to the field of information handling system thermal management, and more particularly to server information handling system thermal management enhanced by estimated energy states.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Server information handling systems process client requests through network interfaces. A typical server information handling system is built with a number of different processing components that cooperate to execute instructions to process information stored in memory. Server information handling systems are often deployed in large numbers within datacenters that provide power and cooling infrastructure. For example, a data center will often have multiple racks that each support multiple server information handling systems. The rack is placed proximate a source of cooling air, such as an air conditioning vent, so that cooling fans in the server information handling systems and rack force cooling airflows over the processing components to remove excess thermal energy. Without cooling airflow, server information handling systems concentrated in a rack will typically overheat leading to forced shutdowns typically needed to prevent damage to the processing components. In addition, the rack generally includes backed-up power supplies that meter power to each server information handling system in the rack. Typically, the power supplies in the rack cannot meet the power requirements of all of the server information handling systems in the rack operating at full power. Instead, power is allocated between server information handling systems based on system utilization, system priorities and available power.

During normal operations, server information handling systems typically monitor thermal conditions with temperature sensors and adjust cooling fan speeds to maintain desired thermal constraints. If cooling fans cannot provide adequate cooling airflow to maintain desired thermal constraints, then additional steps are generally taken to reduce the creation of thermal energy, such as throttling CPUs. Generally, thermal constraints are maintained by a baseboard management controller (BMC) or other processor that executes firmware and provides out-of-band management control of the server information handling system, such as remote starts and shutdowns commanded through a management network. In addition to ensuring that processing components are not damaged by excess thermal energy, the BMC typically sets thermal constraints to avoid unnecessary power consumption and acoustics associated with cooling fan operation. One difficulty with setting and maintaining thermal constraints is that exact thermal conditions within a server information handling system are sometimes difficult to discern since a large number of power-consuming components are usually included within the server information handling system. Generally, BMC thermal controls incorporate a safety margin that errs towards maintaining thermal conditions below acceptable levels, such as by running cooling fans slightly faster than necessary or throttling CPUs slightly earlier than necessary. The size of this safety margin relates to the amount of uncertainty regarding actual versus sensed thermal conditions, and generally results in greater acoustics and power consumption at the server information handling system.

PCI cards are one example of a power consuming component that does not typically include a thermal sensor. At manufacture, thermal characteristics of installed PCI cards may be tested and included in a look-up table for reference by a BMC to provide a predetermined cooling fan response. However, if an end user replaces the installed PCI card or adds additional PCI cards, the thermal characteristics become unknown so that the user must manually configure cooling fan settings or accept sub-optimal thermal management. Manual configuration of thermal parameters tends to be complex so that end users are likely to simply accept sub-optimal performance, resulting in a reduced end user experience. A multitude of other types of power consuming components are generally included in a server information handling system that do not report sensed temperatures or independently qualify for thermal characterization estimates; yet, the many different components add up to have an impact on thermal performance. Generally, these components are managed by setting an open loop fan speed set by system characterizations from development testing. In addition, even components that include temperature sensors sometimes fail to provide accurate sensed conditions, such as in the event of failure or during boot, when the thermal control typically runs on a "blind" hard-coded fan speed that trades off thermal risk and acoustics.

SUMMARY OF THE INVENTION

Therefore a need has arisen for a system and method which provides information on thermal conditions within an information handling system for managing thermal constraints.

In accordance with the present invention, a system and method are provided which substantially reduce the disadvantages and problems associated with previous methods and systems for managing thermal constraints associated with an information handling system. Thermal conditions at discrete locations within an information handling system are estimated by applying sensed temperatures, component power consumption and cooling airflow. The estimated thermal conditions provide more accurate control of cooling airflow and power consumption to manage compliance with thermal constraints.

More specifically, a server information handling system is built in a housing having plural processing components that cooperate to process information. For example, one or more processors execute instructions stored in memory to process information stored in memory, such as instructions for responding to client requests that are sent through a backplane to a network interface card for communication through a network. One or more cooling fans disposed in the housing draws a cooling air flow across the processing components to remove excess thermal energy. One or more temperature sensors disposed in the housing sense the temperature of ambient air, such as an inlet or exhaust temperature, or particular component's temperature, such as a processor temperature. A thermal manager executing on a processing component, such as a BIOS executing on a chipset or firmware executing on a BMC, manages thermal conditions in the housing to meet thermal constraints by setting a cooling fan airspeed or by altering processing component power consumption, such as by reducing processor clock speed to reduce creation of excess thermal energy. The thermal manager estimates thermal conditions at discrete locations of the housing by reading power consumption of components at the discrete locations and then manages thermal conditions based upon the estimated thermal conditions. For example, ambient temperature at a PCI backplane communications manager is estimated by using the lane width of the PCI card as a proxy for power consumption and applying conservation of energy for determining a temperature increase associated with the power consumption and cooling airflow at the PCI card.

The present invention provides a number of important technical advantages. One example of an important technical advantage is that an information handling system has more precise control of thermal conditions by applying component power consumption, cooling airflow rates and available ambient temperatures sensed in the housing to generate virtual sensed temperatures. A thermal manager uses the virtual sensed temperatures to manage thermal conditions at discrete locations by addressing energy dissipation and cooling airflow associated with the discrete locations. Precise thermal management at discrete locations allows a minimum cooling fan setting to maintain desired thermal constraints, thus reducing cooling fan acoustics, reducing cooling fan power consumption, and protecting individual components and subsystems from thermal over temperatures.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

Information handling system thermal management applies estimates of subcomponent power consumption to determine intermediate thermal states in the system that provide discrete control of thermal conditions. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
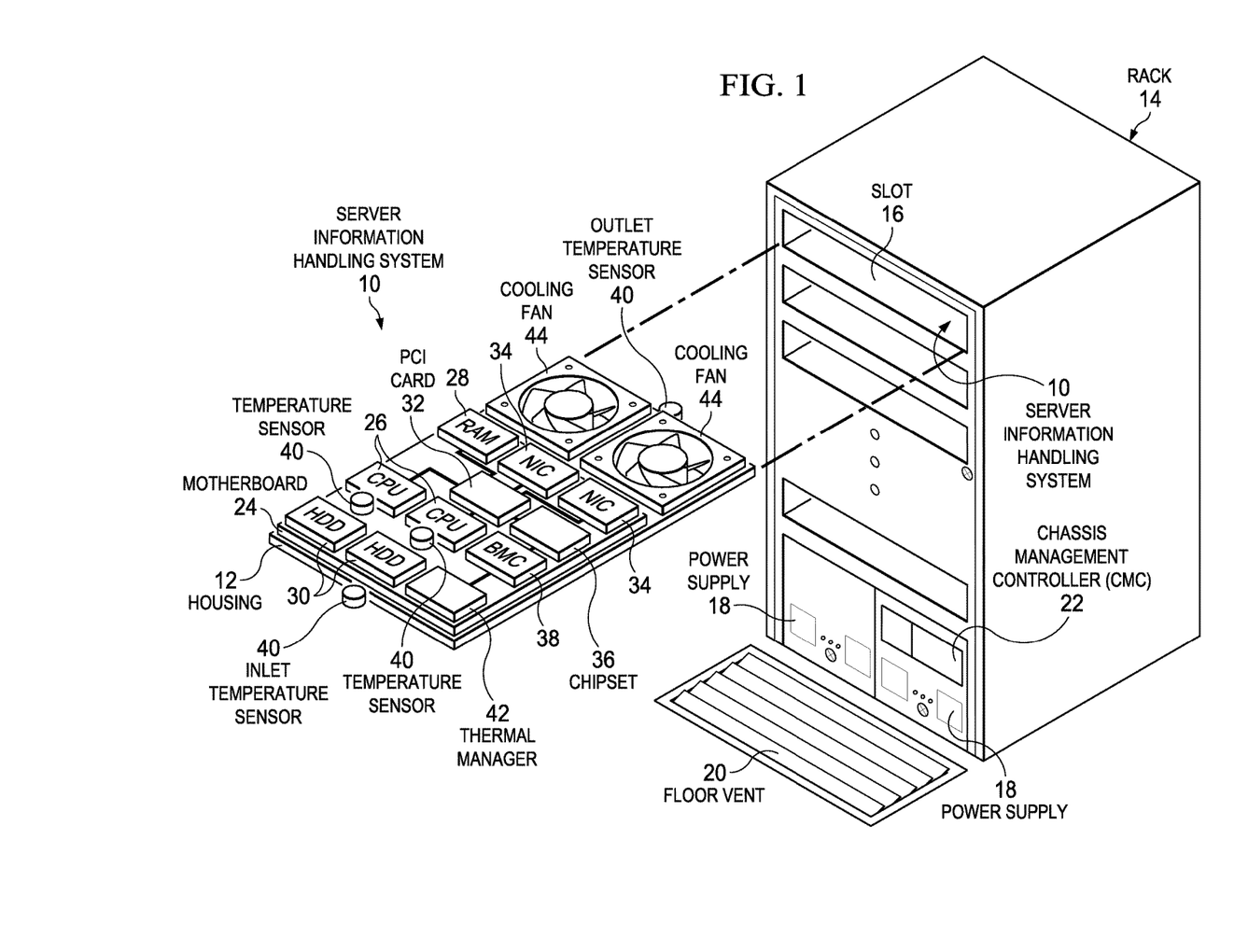
FIG. 1 depicts a block diagram of information handling system thermal management by estimated energy states.

Referring now to FIG. 1, a block diagram depicts information handling system 10 thermal management by estimated energy states. In the example embodiment, information handling system 10 is a server built into a housing 12 that resides with plural other server information handling systems a rack 14. Rack 14 has plural vertically-stacked slots 16 that accept server information handling systems 10 and plural power supplies 18 that provide power to server information handling systems 10. In a data center environment, rack 14 has pretreated cooling air provided from a floor vent 20 to aid removal of thermal energy from server information handling systems 10 disposed in rack 14. Power supplies 18 are assigned power based upon availability at the data center and then allocate power to individual server information handling systems 10 under the management of a chassis management controller (CMC) 22. CMC 22 aids coordination of operating settings so that server information handling systems do not exceed thermal or power usage constraints.

Housing 12 includes a motherboard 24 that provides structural support and electrical signal communication for processing components disposed in housing 12 that cooperate to process information. For example, one or more central processing units (CPUs) 26 execute instructions stored in random access memory (RAM) 28 to process information, such as responses to server requests by client information handling systems. One or more persistent storage devices, such as hard disk drives (HDD) 30 store information maintained for extend periods and during power off states. A backplane communications manager, such as a PCI card 32, interfaces processing components to communicate processed information, such as communications between CPUs 26 and network interface cards (NICs) 34 that are sent through a network, such as a local area network. A chipset 36 includes various processing and firmware resources for coordinating the interactions of processing components, such as a basic input/output system (BIOS). A baseboard management controller (BMC) 38 interfaces with chipset 36 to provide out-of-band management functions, such as remote power up, remote power down, firmware updates, and power management. For example, BMC 38 receives an allocation of power from CMC 22 and then monitors operations of the processing components to ensure that power consumption does not exceed the allocation. As another example, BMC 38 receives temperatures sensed by temperature sensors 40 and applies the temperatures to ensure that thermal constraints are not exceeded.

In the example embodiment, a thermal manager 42 executes as firmware on BMC 38 to manage thermal conditions within housing 12, such as the thermal state at particular processing components or ambient temperatures at discrete locations associated with housing 12. Thermal manager 42 controls the speed at which cooling fans 44 rotate to adjust a cooling airflow rate in housing 12 so that enough excess thermal energy is removed to prevent an over temperature condition, such as overheating of a CPU 26 or an excessive exhaust temperature as measured by an outlet temperature sensor 40. In the event that cooling fans 44 cannot provide sufficient cooling airflow to meet a thermal constraint, thermal manager 42 reduces power consumption at one or more of the processing components to reduce the amount of thermal energy released into housing 12, such as by throttling the clock speed of one or more of CPUs 26. Thermal manager 42 responds to extreme thermal conditions that place system integrity in jeopardy by shutting down information handling system 10, such as might happen if floor vent 20 fails to provide treated air due to a data center cooling system failure.

In order to more effectively manage thermal conditions associated with housing 12, thermal manager 42 applies conservation of energy to estimate thermal conditions at discrete locations associated with housing 12 and then uses the estimated thermal conditions for more precise control of the overall thermal state of information handling system 10. For example, thermal manager 42 performs a double energy balance based upon available measures of power consumption, cooling fan speed and sensed thermal conditions to estimate intermediate temperatures at discrete locations within housing 12. The estimated intermediate temperatures provide more precise control of the thermal conditions at discrete locations to maintain thermal constraints, such as maximum ambient temperatures of components that do not include temperature sensors or maximum inlet temperatures for components downstream in the cooling airflow from the estimated ambient temperature. Estimated intermediate temperatures may be applied in an overall system conservation of energy model so that fan speed and component power consumption are determined to maintain thermal constraints, such as maximum exhaust temperatures. Thermal manager 42 estimates discrete thermal conditions at locations within housing 12 by applying available component configuration information, such as a component inventory kept by BMC 38, and sensed, known or estimated power consumption of the components. For example, BMC 38 may use actual power consumption of components or subassemblies if actual power consumption is available, know power consumption stored in the BMC inventory for known components, or estimated power consumption based upon the type of component and the component's own configuration. An example of estimated power consumption is a general estimate of power consumption stored in BMC 38 for unknown PCI cards 32 with the general estimate based upon the width of the PCI card, i.e., the number of links supported by the PCI card. In one embodiment, as estimated intermediate thermal conditions are applied to generate fan and power consumption settings, a self-learning function compares expected results and models component and subassembly thermal characteristics so that more accurate estimates are provided over time.

Figure 2:
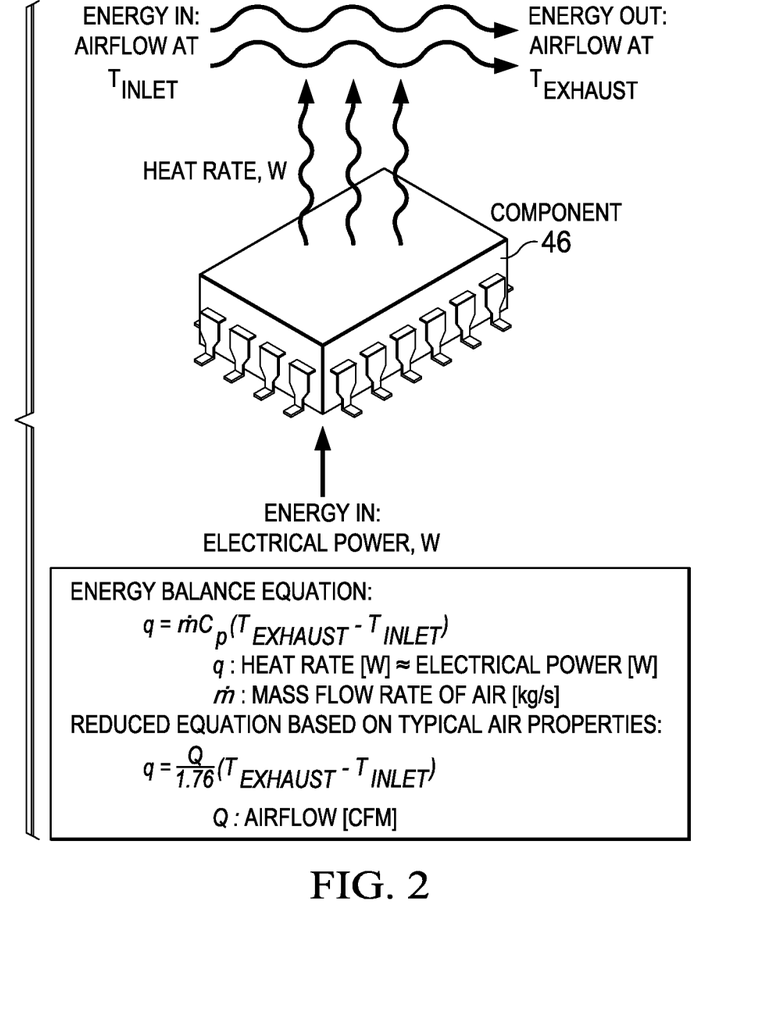
FIG. 2 depicts a mathematical model for estimating component thermal performance and setting thermal controls.

Referring now to FIG. 2, a mathematical model is depicted for estimating component 46 thermal performance and setting thermal controls. According to the law of conservation of energy, the total energy state of an information handling system is maintained as a balance of the energy into the system and the energy out of the system. The energy balance may be broken into a sum of plural components 46 where each component 46 has a known or estimated power consumption that introduces thermal energy into the information handling system. The system energy balance becomes the energy into the system as reflected by an airflow inlet temperature, the thermal energy released by the sum of the components 46 that consume power in the system and the energy out of the system as reflected by an airflow exhaust temperature. Energy removed from the system relates to the mass flow rate of air flowing through the system and the coefficient for energy absorption of the cooling airflow. Simplified for the coefficient that typically applies to atmospheric air, the energy released by electrical power consumption is equal to airflow in cubic feet per minute divided by a constant of 1.76 and multiplied by the difference between the exhaust temperature and inlet temperature. Thermal manager 42 applies this formula to set cooling fan speed to meet exhaust temperature constraints. For internal components and subassemblies, thermal manager 42 determines a minimum fan speed to keep ambient temperature of a component within a desired constraint by determining an "inlet" temperature estimated for air as it arrives at the component based upon power consumption of other components in the air flow before the air arrives at the component of interest. The increase in temperature exhausted at the component of interest is estimated based upon the power consumed by the component of interest and the cooling airflow rate. Thus, a fan speed is set that prevents an "exhaust" from the component of interest that is in excess of thermal constraints associated with the component. Alternatively, estimated temperatures at intermediate components may be summed and applied to set a fan speed that achieves a desired overall system thermal condition, such as an exhaust temperature constraint.

Applying conservation of energy and component power consumption to manage thermal conditions allows more precise control of thermal conditions and discrete control within an information handling system housing even where measurements of actual thermal conditions by a temperature sensor are not available. A modular energy balance thermal controller allows combined serial energy balances to account for the effect of reduced inlet temperatures when increasing speeds for downstream energy balances. This flexibility is provided by using energy balances independently to solve for either exhaust temperature or airflow on a system-wide basis or at discrete locations within a system. Subsystem power consumption based upon a component or collection of components allows estimation of upstream preheat for other components within an information handling system housing. For example, components that do not dissipate substantial heat by power consumption are scaled to have a reduced impact on airflow temperatures. One example of such a component is a cooling fan, which dissipates 60 to 80% of power consumption as heat and 20 to 40% as air moving, but is generally ignored with conventional thermal controls. By adding fan power and scaling to match efficiency for the system, a more precise picture of thermal conditions within a housing is provided. Isolating power consumption of specific regions, subsystems or components of interest, such as PCI cards, allows the power readings for the subsystems to include static power from non-relevant components that are accounted for by subtracting a static power value. Assigning scaled values that relate heat dissipation and power consumption for each subsystem provides more exact estimates of thermal conditions and more precise control of airflow and power settings based upon preheat that occurs in the airflow as the airflow passes through the housing. Approaching thermal management based upon a serial summation of subsystem thermal conditions supports the use of static values for selected subsystems to subtract thermal overhead or exclude dynamic readings, such as to control fan speed to achieve a static reading instead of monitoring an available dynamic reading.

Using subsystem thermal condition estimates aids in achieving more accurate fan speed settings for a desired exhaust constraint since airflow-to-fan speed relationships are set based on actual system configuration and component power consumption. Summed energy balances of discrete subsystems disposed in a housing differentiate thermal control based on hardware inventory, system state, or system events to enhance control accuracy. Airflow is scaled to account for component count based upon active components and functions being performed at the components during control time periods. When solving for airflow settings needed to meet a component or system-wide thermal constraint, the inlet or exhaust temperature is generally a fixed requirement that aligns with a temperature limit so that selectively setting static values allows derivation of control values without using available dynamic values. Dynamically calculated inlet ambient with a fixed static exhaust ambient or a fixed inlet ambient and a dynamically calculated exhaust ambient provides a better estimate of system airflow. As power use fluctuates, feedback and feed forward control of thermal conditions based on average power consumption tends to dampen cooling fan setting fluctuations that occur when fan settings are made based upon instantaneous power readings alone. Averaging measured fan speeds also helps to simplify correlations and to "learn" thermal characteristics of subsystems as thermal conditions respond over time to changes in power consumption at various subsystems. For example, each fan within a housing can run at different PWM speed settings. Calculating an average PWM from individual fan PWM speed settings allows a PWM percent to airflow relationship. During operating conditions that have limited availability of dynamically sensed thermal conditions, such as at startup, during fan failure, during sensor failure and during baseline cooling, estimated subsystem thermal conditions based upon subsystem power consumption provides a model for fan speed settings. Generally, fan setting control based upon a summation of estimated and/or actual subsystem thermal conditions allows defined minimum fan speeds for a system-wide constraint with supplemental cooling of critical components based on closed loop feedback.

Figure 3:
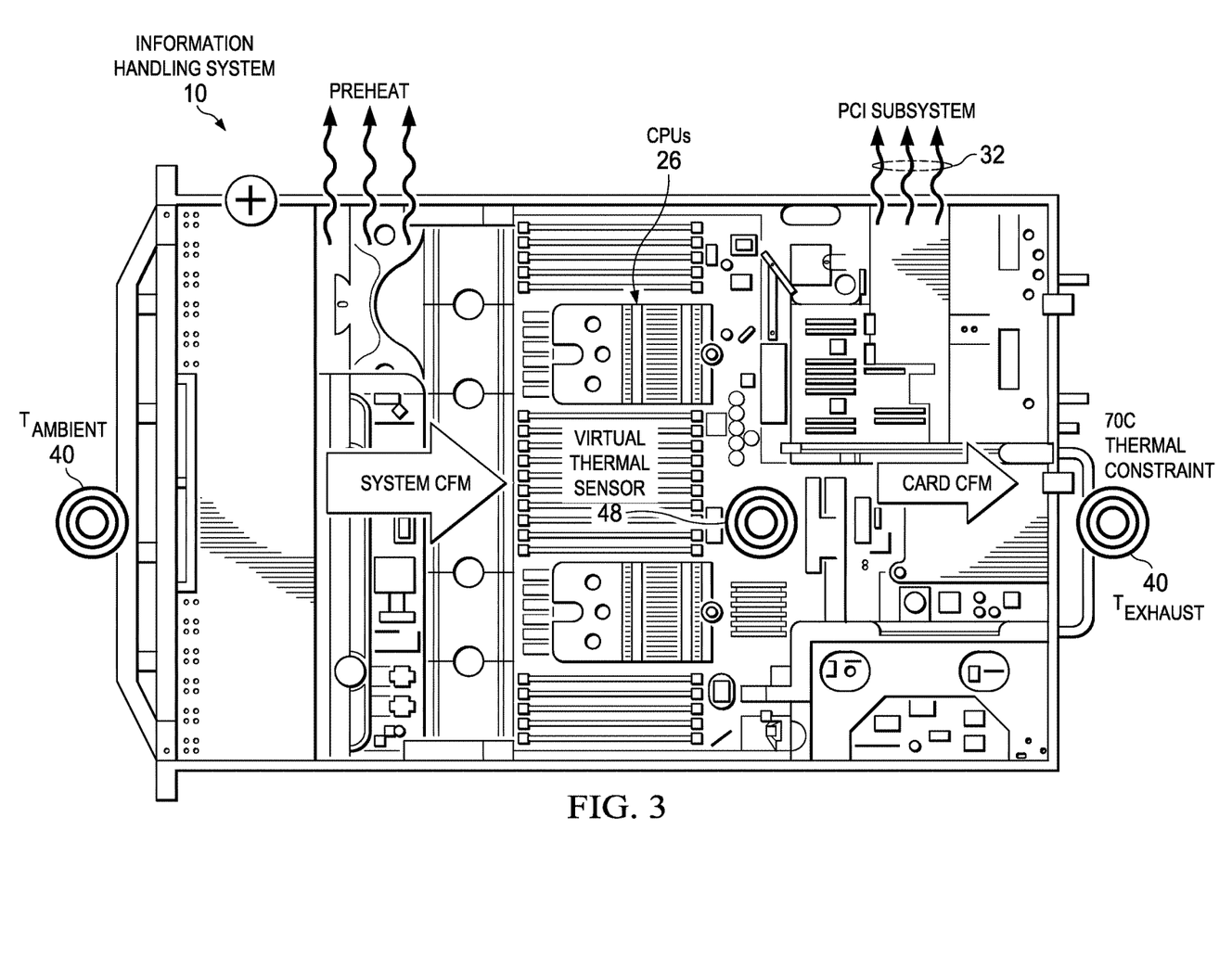
FIG. 3 depicts an upper view of a server information handling system having thermal management based upon subsystem thermal estimated conditions.

Referring now to FIG. 3, an upper view depicts a server information handling system 10 having thermal management based upon subsystem thermal estimated conditions. External air drawn into information handling system 10 has an ambient temperature (Tambient) measured by an inlet temperature sensor 40 and an airflow rate (System CFM) determined by the speed at which a cooling fan spins. As the cooling airflow passes through housing 12, it absorbs thermal energy resulting in a preheat of the airflow for downstream components. The cooling airflow is forced from information handling system 10 at an exhaust with an exhaust temperature (Texhaust) fixed at 70 degrees C. as a requirement or, in alternative embodiments, measured by an exhaust temperature sensor 40. The thermal manager adapts cooling fan speed so that the cooling air flow temperature Texhaust maintains a thermal constraint, such as 70 degrees Celsius.

In the example embodiment depicted by FIG. 3, a virtual thermal sensor 48 is generated by the thermal manager at a location in information handling system 10 that receives preheated airflow, such as airflow that has passed by CPUs 26. The thermal manager applies configuration information stored in the BMC to determine the components that preheat airflow to virtual thermal sensor 48 and determines power consumed by the components to arrive at a virtual temperature measured by virtual thermal sensor 48. For example, the thermal manager applies power consumed by CPUs 26 and static power consumption associated with other preheat components to determine by conservation of energy the ambient temperature of air exhausted from CPUs 26 to arrive at the virtual temperature. The virtual temperature is then used as an inlet temperature to a PCI card subsystem 32 so that an ambient temperature of PCI card subsystem 32 is computed based upon energy consumed by PCI card subsystem 32. In the example embodiment, PCI card subsystem 32 exhausts as Texhaust measured by the exhaust sensor 40 so that control of the ambient temperature within PCI card subsystem 32 provides control of the overall system exhaust. The increase in thermal energy caused by PCI card subsystem 32 as reflected by the increase from the virtual temperature to the exhaust temperature is estimated using conservation of energy applied to the energy consumption of PCI card subsystem 32. Generally, PCI card subsystem 32 power consumption is measured directly based upon power assigned by a power subsystem or estimated with a static value; in an alternative embodiment, power consumption may be derived from estimates using conservation of energy applied to known power consumption and thermal conditions in the housing. Thus, the power consumed by PCI card subsystem 32 may be dynamically determined by actual measurements of power usage, by stored power usage based on the inventory of the PCI card maintained in the BMC or by an estimate of power consumption based upon characteristics of the PCI card, such as the width of the PCI card.

Having one or more intermediate virtual thermal sensors 48 provides flexibility in managing system operation by using a virtual temperature measurement as a dynamic thermal control input or a static thermal control constraint. For example, if PCI card subsystem 32 is controlled to have a static value of 50 degrees Celsius, then fan speed and CPU power consumptions may be adjusted to maintain that value. If Texhaust has a constraint of 70 degrees Celsius, then excessive temperatures might occur during low CPU power usage due to low fan speed settings needed to maintain the 50 degrees Celsius virtual thermal sensor 48 measurement and temperature increases of greater than 20 degrees Celsius from PCI card power consumption. In such an instance, if precise power control is available for desired components, thermal control might focus on Texhaust so that the virtual temperature falls below 50 degrees Celsius or might focus on power consumption by PCI card subsystem 32 so that less thermal energy is released after virtual thermal sensor 48. Typically, PCI card subsystems do not at this time allow control of thermal energy release, such as by throttling a processor clock, however, such capabilities may be introduced for PCI cards or other components in the future. Discrete control of thermal conditions at different locations within information handling system 10 is provided by generating virtual thermal sensors at the desired locations and then selectively treating the values as dynamic or static for control purposes.

Figure 4:
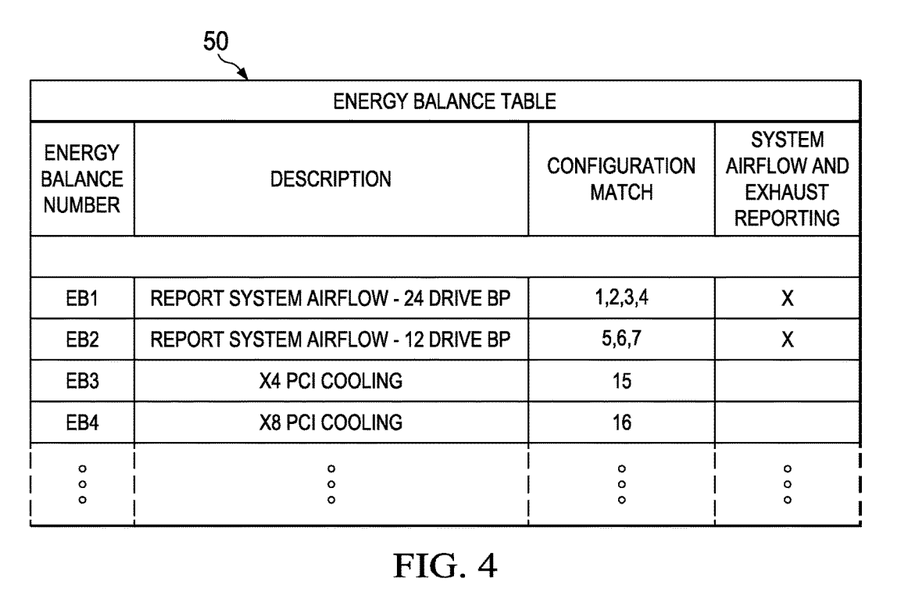
FIG. 4 depicts a user interface for managing thermal conditions of a server information handling system with stored configuration settings of subsystems within the information handling system.

Referring now to FIG. 4, a user interface is depicted for managing thermal conditions of a server information handling system with stored configuration settings of subsystems within the information handling system. Energy balance table 50 includes energy balance parameters for components built into information handing system 10 as well as estimated values for potential replacement components, such as non-specific PCI cards having a width of four or eight lanes. By including configuration match information that relates components to energy consumption, the thermal manager is able to estimate a thermal condition with the subsystems should one be detected.

Figure 5:
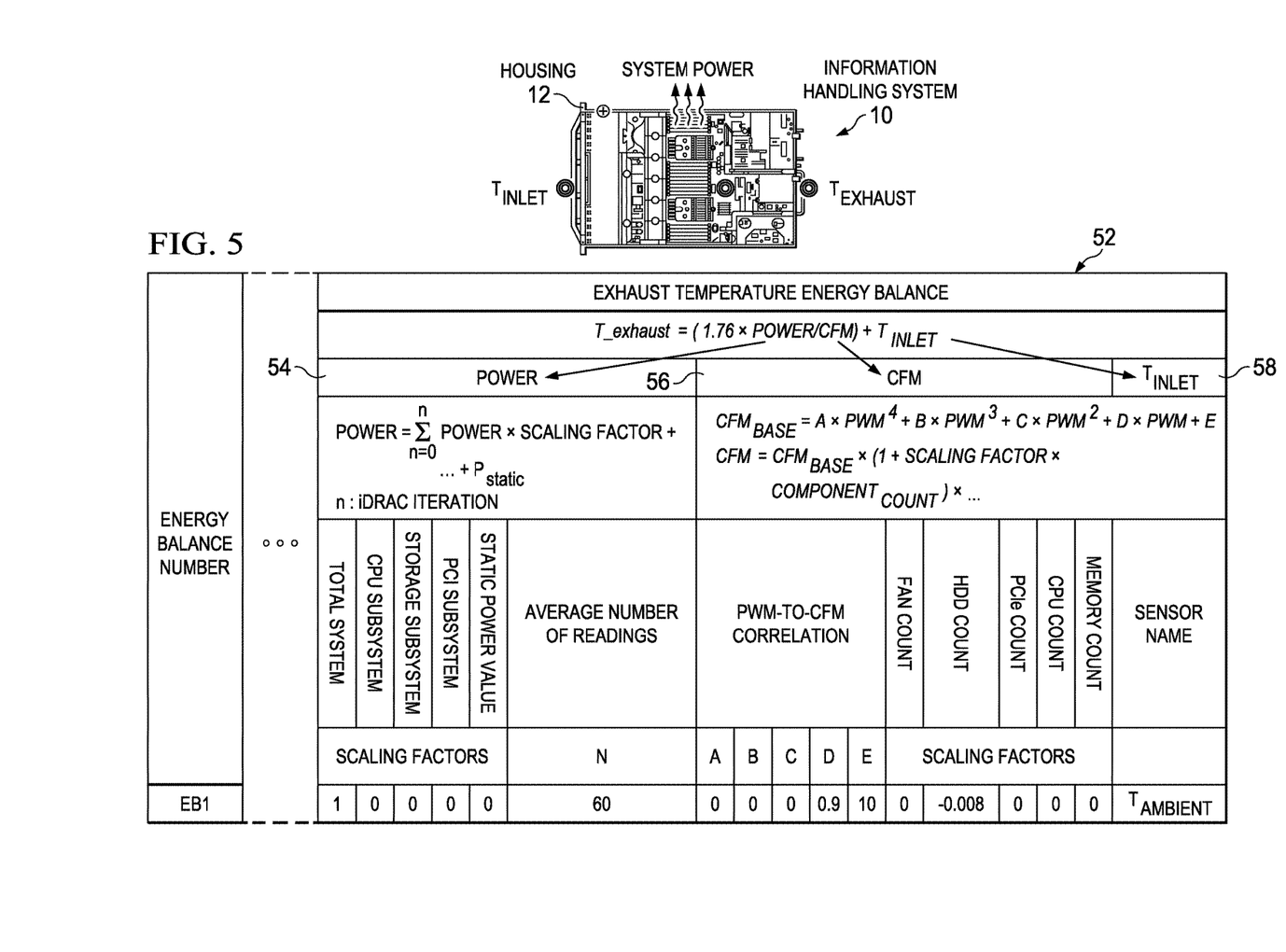
FIG. 5 depicts a user interface for estimating system airflow and exhaust temperature based upon conservation of energy within an information handling system housing.
Figure 7:
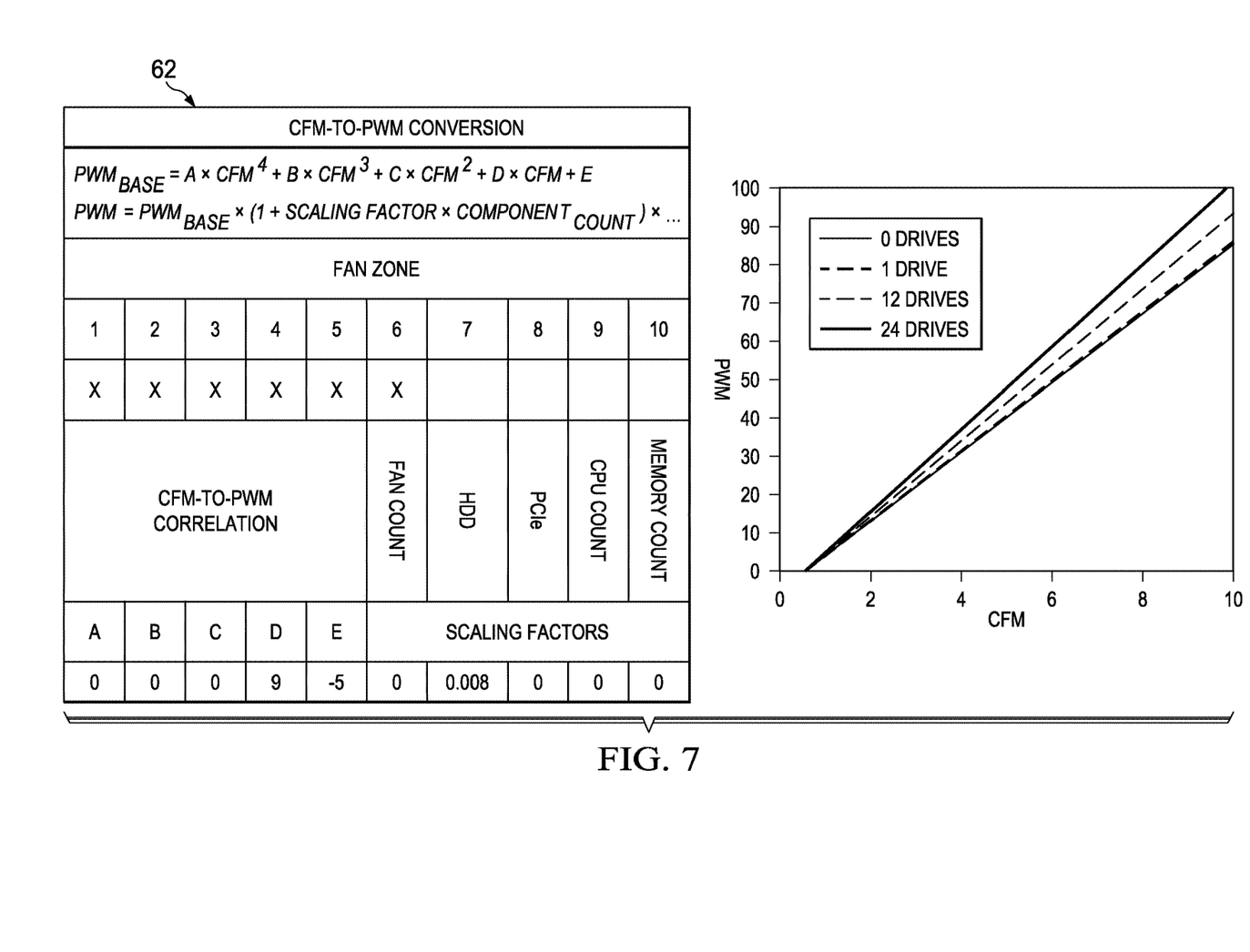
FIG. 7 depicts a conversion of determined air flow rates to cooling fan pulse width modulation settings.

Referring now to FIG. 5, a user interface is depicted for estimating system airflow and exhaust temperature based upon conservation of energy within an information handling system 10 housing 12. An exhaust temperature energy balance table 52 applies power, airflow and sensed temperature values to estimate thermal states and set control for desired airflow and temperature parameters. A power window 54 depicts a power dissipation calculation performed for each subsystem having an energy balance number in energy balance table 50. A total system power dissipation represents power use by all desired components, which in this example embodiment includes the cooling fan. Scaling factors may be set to adjust the relative power consumption in various configuration modes in response to dynamic power settings. A static power setting allows control to achieve a desired power setting at a component. A CFM window 56 depicts a mass flow calculation for determination of airflow to achieve the energy balance with the determined power settings for each component. The example embodiment depicted by FIG. 5 estimates airflow and exhaust temperatures, including with virtual temperature sensors. FIG. 7 described below provides mass airflows converted to cooling fan pulse width modulation values to assign cooling fan rotation speeds based upon individual component configurations adjusted for scaling.

Figure 6:
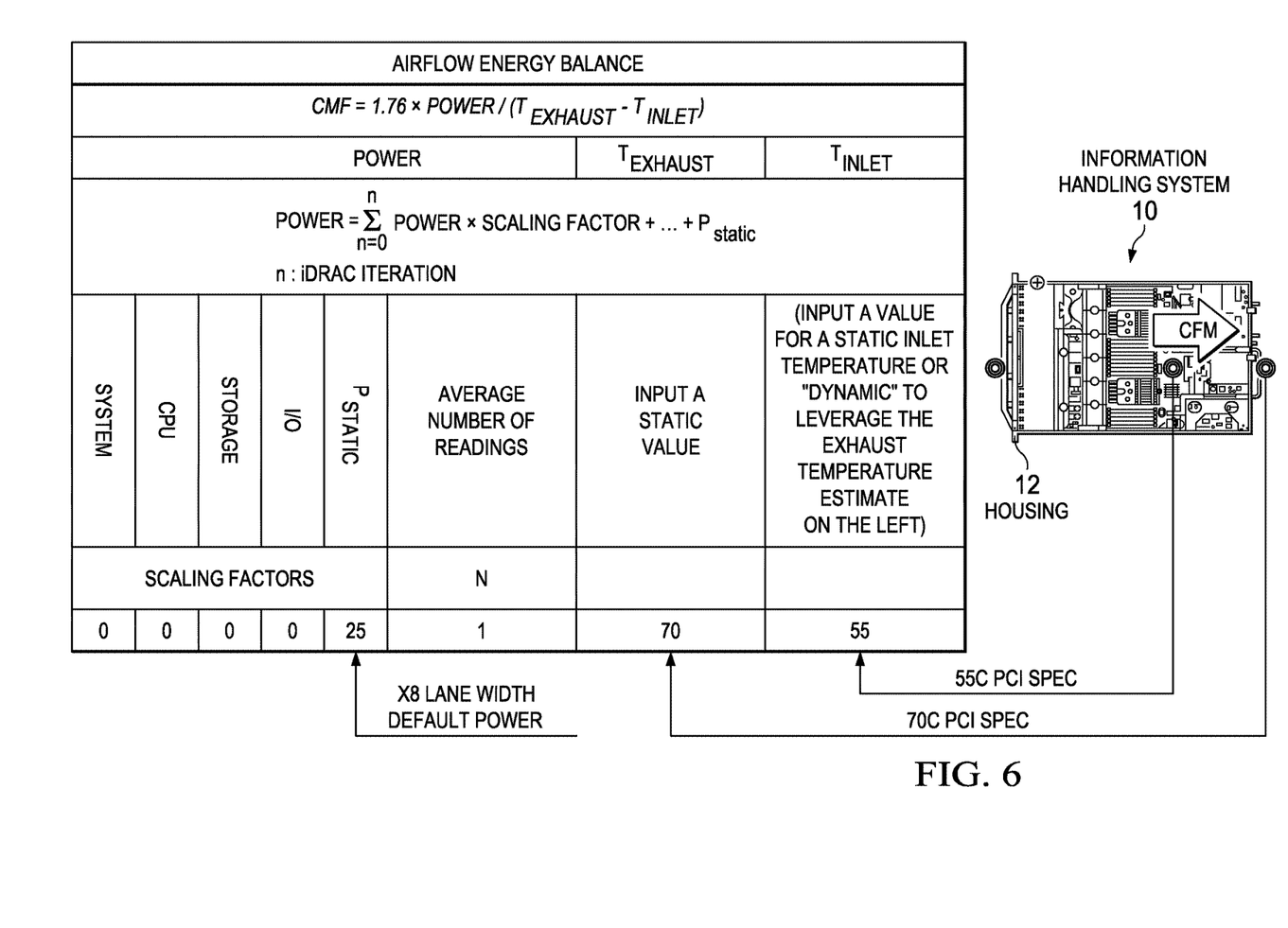
FIG. 6 depicts a user interface for setting cooling airflow to meet defined conditions, such as temperature defined as a fixed requirement, a measurement read from a sensor or a measurement leveraged from a virtual sensor reading.

Referring now to FIG. 6, a user interface is depicted for setting cooling airflow to meet defined conditions, such as temperature defined as a fixed requirement, a measurement read from a sensor or a measurement leveraged from a virtual sensor reading. The user interface of FIG. 6 computes how much airflow is required to cool a component. The temperature and power values can be static or dynamic, however, one value is set to static to support control of the other values to meet a targeted static condition. An airflow energy balance table 60 supports mass airflow and exhaust temperature estimates with dynamic or static settings in the power consumption of the components. An average # of readings input aids in adjusting for thermal lag related to delays between dissipation of power by components and temperature impacts. In the example embodiment, an exhaust temperature of 70 degrees Celsius is set for exhaust from a PCI card based upon a static power setting for a lane width of eight lanes. For example, a lane width of eight lanes defines an estimated power consumption for the card and the 70 degrees Celsius temperature is an overall system safety constraint. The example embodiment sets a static inlet temperature for the PCI card of 55 degrees Celsius, such as might be an input limit for the PCI card or so that an airflow rate is determined that maintains the desired exhaust temperature constraint. Alternatively, the inlet temperature may be dynamic from a physical sensor or from a virtual sensor computed with a conservation of energy estimated based upon upstream component power consumption. If the airflow rate is less than another airflow rate required at a different location in housing 12, the constraint will be met without applying the determined airflow rate. For example, if the airflow rate to maintain 55 degrees Celsius exhaust from the CPUs is greater than the airflow rate required to maintain PCI card thermal conditions, then the CPU airflow rate will apply. In this manner, discrete airflow rates for different portions of information handling system 10 will provide more exact thermal management for components disposed within housing 12.

Referring now to FIG. 7, a conversion of determined air flow rates to cooling fan pulse width modulation settings is depicted. In the example embodiment, different levels of cooling airflow and PWM settings are depicted for different numbers of hard disk drives disposed in housing 12. In alternative embodiments, varying cooling fan speeds are provided based upon system configuration as detected by the BMC and applied to discrete locations within the housing 12 related to the component positions.

Although the present invention has been described in detail, it should be understood that various changes, substitutions and alterations can be made hereto without departing from the spirit and scope of the invention as defined by the appended claims.

What is claimed is:

1. A system for thermal management at an information handling system, the system comprising:
    plural temperature sensors operable to sense temperatures at plural locations associated with the information handling system;
    a power supply operable to provide power to plural subsystems of the information handling system;
    a cooling fan operable to generate a cooling airflow in the information handling system at plural airflow rates; and
    a thermal manager stored in non-transitory memory and interfaced with the plural temperature sensors, the power supply and the cooling fan, the thermal manager operable to execute on a processing component to apply at least the power provided to one of the plural subsystems to determine estimate a thermal condition of cooling airflow proximate the one of the plural subsystems and to apply the estimated thermal condition to set the cooling fan airflow rate, the one of the plural subsystems lacking a thermal sensor, the thermal condition at the discrete location derived from at least an estimated airflow temperature entering the discrete location and power consumed by a subcomponent at the discrete location, comparing the thermal condition with a thermal constraint, and in response to comparing, commanding airflow through the information handling system housing at a second airflow rate to adjust the airflow to the second airflow rate that exhausts the airflow from the discrete location at a predetermined temperature.

2. The system of claim 1 wherein the thermal condition comprises an ambient temperature within the one of the plural subsystems.

3. The system of claim 2 wherein the one of the plural subsystems comprises a backplane communications manager.

4. The system of claim 3 wherein the backplane communications manager is a PCI card.

5. The system of claim 4 wherein the thermal condition is derived at least in part from a width of the PCI card.

6. The system of claim 1 wherein the thermal condition comprises an inlet temperature at another of the plural subsystems.

7. The system of claim 1 wherein the thermal manager applies the thermal condition to set the cooling fan airflow rate in order to maintain a thermal constraint of the one of the plural subsystems.

8. The system of claim 1 further comprising a training module monitoring the thermal module and operable to apply the thermal conditions over time to generate a thermal profile of the one of the plural subsystems.

9. A method for thermal management at an information handling system, the method comprising:
monitoring plural temperature sensors disposed in the information handling system;
monitoring power applied to plural subcomponents in the information handling system;
commanding airflow through the information handling system housing at a first airflow rate;
applying at least one of the plural temperatures, the power applied to one of the plural subcomponents and the first airflow rate to determine a thermal condition of cooling airflow at a discrete location in the information handling system, the discrete location lacking a temperature sensor; and
applying the thermal condition at the discrete location derived from at least an estimated airflow temperature entering the discrete location and power consumed by a subcomponent at the discrete location, comparing the thermal condition with a thermal constraint, and in response to comparing, commanding airflow through the information handling system housing at a second airflow rate to adjust the airflow to the second airflow rate that exhausts the airflow from the discrete location at a predetermined temperature.

10. The method of claim 9 wherein the thermal condition at the discrete location comprises an ambient temperature of the one of the subsystems having monitored power.

11. The method of claim 9 wherein the thermal condition at the discrete location comprises an exhaust temperature of the one of the subsystems having monitored power.

12. The method of claim 9 wherein the one of the subsystems having monitored power comprises a backplane communications manager and wherein the thermal condition is further determined based upon a width of the backplane communications manager.

13. An information handling system comprising:
a housing;
a cooling fan disposed in the housing and operable to generate a cooling airflow at selectable airflow rates;
plural temperature sensors operable to detect temperatures at plural locations associated with the housing;
plural subsystems disposed in the housing and operable to cooperate to process information, at least some of the plural subsystems lacking a temperature sensor;
a power supply operable to provide power to the plural subsystems; and
a thermal manager interfaced with the plural temperature sensors, the power supply and the cooling fan, the thermal manager operable to determine estimate a thermal condition proximate the one of the plural subsystems lacking a temperature sensor based at least in part on one or more temperatures measured at one or more locations and power supplied to one or more of the plural subsystems and to apply the thermal condition to set the cooling fan airflow rate to achieve a predetermined temperature of the cooling airflow exiting at the one of the plural subsystems, the temperature of the cooling airflow determined based at least in part upon the thermal condition and power consumed by the one of the plural subsystems.

14. The information handling system of claim 13 wherein the one of the plural subsystems comprise a backplane communication manager.

15. The information handling system of claim 14 wherein the thermal manager determines the backplane communication manager thermal condition by determining power consumption based upon a width of the backplane communications manager.

16. The information handling system of claim 13 wherein the thermal condition is an ambient temperature of the one of the plural subsystems.

17. The information handling system claim 16 wherein the thermal manager is further operable to set the cooling fan airflow rate to maintain a desired ambient temperature.

18. The information handling system of claim 16 wherein the thermal manager is further operable to apply the ambient temperature to set the cooling fan airflow rate to maintain a desired exhaust temperature of the housing.

* * * * *

UNITED STATES PATENT AND TRADEMARK OFFICE
CERTIFICATE OF CORRECTION

PATENT NO. : 10,136,558 B2
APPLICATION NO. : 14/446704
DATED : November 20, 2018
INVENTOR(S) : Hasnain Shabbir and Dominick A. Lovicott It is certified that error appears in the above-identified patent and that said Letters Patent is hereby corrected as shown below:

In the Claims

In Column 10, Line 50, please remove "estimate";
In Column 10, Line 52, please remove "estimated";
In Column 11, Line 34, please remove "estimated";
In Column 12, Line 19, please remove "estimate".

Signed and Sealed this
Fifth Day of February, 2019

Andrei Iancu
*Director of the United States Patent and Trademark Office*